United States Patent
Sim

(10) Patent No.: US 7,638,263 B2
(45) Date of Patent: Dec. 29, 2009

(54) OVERLAY ACCURACY MEASUREMENT VERNIER AND METHOD OF FORMING THE SAME

(75) Inventor: Guee Hwang Sim, Gangneung-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 543 days.

(21) Appl. No.: 11/479,341

(22) Filed: Jun. 30, 2006

(65) Prior Publication Data
US 2007/0212650 A1    Sep. 13, 2007

(30) Foreign Application Priority Data
Mar. 8, 2006    (KR) ...................... 10-2006-0021734

(51) Int. Cl.
G03F 7/00    (2006.01)
G03F 7/26    (2006.01)

(52) U.S. Cl. ...................... 430/311; 430/313; 430/322; 430/316; 430/314; 430/30; 430/5; 430/22; 430/394; 216/39; 216/41; 216/84

(58) Field of Classification Search .................. 430/311, 430/313, 322, 316, 314, 30, 5, 22, 394; 216/39, 216/41, 84
See application file for complete search history.

(56) References Cited

U.S. PATENT DOCUMENTS 5,503,962 A * 4/1996 Caldwell .................... 430/317
6,180,537 B1 * 1/2001 Tseng ........................ 438/758
2003/0174879 A1    9/2003 Chen

FOREIGN PATENT DOCUMENTS

| JP | 2003-272993 | 9/2003 |
| KR | 1020040038035 A | 5/2004 |
| KR | 1020050063028 A | 6/2005 |
| KR | 1020050111821 A | 11/2005 |

* cited by examiner

Primary Examiner—Mark F Huff
Assistant Examiner—Caleen O Sullivan
(74) Attorney, Agent, or Firm—Marshall, Gerstein & Borun LLP

(57) ABSTRACT

An overlay accuracy measurement vernier and a method of forming the same. According to one embodiment, the method of forming the overlay accuracy measurement vernier includes the steps of forming a first vernier pattern in a predetermined region on a semiconductor substrate; etching the semiconductor substrate using the first vernier pattern as a mask, forming a trench of a first depth; forming a second vernier pattern having a width wider than that of the first vernier pattern, the second vernier pattern including the first vernier pattern; performing an etch process using the second vernier pattern as a mask, thus forming a trench of a second depth, which has a step of a predetermined width; stripping the first and second vernier patterns and then forming an insulating film to bury the trench; and, etching the insulating film so that the semiconductor substrate of the vernier region is exposed.

5 Claims, 5 Drawing Sheets

Puddle Type

OVERLAY ACCURACY MEASUREMENT VERNIER AND METHOD OF FORMING THE SAME

BACKGROUND

1. Field of the Invention

The invention relates generally relates to semiconductor devices. More particularly, the invention relates to an overlay accuracy measurement vernier and a method of forming the same, in which a step necessary to measure overlay accuracy is formed after a planarization process in the process of forming a trench of a region in which the overlay accuracy measurement vernier is formed, thereby preventing overlay accuracy measurement error.

2. Discussion of Related Art

In general, a semiconductor device includes a cell region in which a cell for storing data is formed and a peri region in which a circuit element for driving the cells is formed. In the manufacturing process of the semiconductor device, a vernier is used to measure overlay accuracy between an etch process of a first layer and an etch process of a second layer. The overlay accuracy measurement vernier may be formed in a part of the peri region or a scribe line. Hereinafter, a region in which the overlay accuracy measurement vernier will be formed will be described independently from the peri region.

Meanwhile, in flash memory devices that store and erase data through tunneling, a dual trench structure is employed in which trenches for forming isolation films are formed to have different widths and depths in the cell region and the peri region in devices of 70 nm or less, in order to secure a breakdown voltage of an insulating film gap-fill process and a high voltage region.

In the flash memory device employing the dual trench structure as described above, when the trenches are formed in the peri region, a dual trench is formed in such a manner that the trenches are also formed in a region in which the overlay accuracy measurement vernier will be formed and are then formed in the cell region. An insulating film is formed to bury the trenches and is then polished to form the isolation films in the cell region and the peri region. A key open process of the overlay accuracy measurement vernier formation region is then performed.

However, since the trench of the vernier region and the trench of the peri region are formed at the same time, the depth of the trench in the two regions is the same. Accordingly, after a polishing process of the insulating film for forming the isolation film, the vernier is not properly formed in the key open process. As a result, when a mask for an etch process is formed after an opaque film such as a polysilicon film or a tungsten film is deposited, the overlay accuracy measurement vernier is not seen. Accordingly, a problem arises because error is caused or measurement itself is impossible upon overlay accuracy measurement.

SUMMARY OF THE INVENTION

In one embodiment, the invention provides an overlay accuracy measurement vernier and a method of forming the same, in which overlay accuracy measurement error can be prevented by forming trenches of a region in which the overlay accuracy measurement vernier will be formed in the Puddle type.

In another embodiment, the invention provides an overlay accuracy measurement vernier and a method of forming the same, in which a key open process need not be performed, thereby simplifying the process.

According to one aspect, the invention provides an overlay accuracy measurement vernier, including two or more first verniers formed in predetermined regions of a semiconductor substrate with them being separated from each other, and a second vernier formed on the first vernier, the second vernier having a width narrower than that of the first vernier.

The second vernier may preferably have a width of 0.7 nm to 2.0 nm and the first vernier may have a width, which is 0.2 nm to 0.4 nm wider than that of the second vernier.

According to another aspect, the invention provides a method of forming an overlay accuracy measurement vernier, including the steps of forming a first vernier pattern in a predetermined region on a semiconductor substrate; etching the semiconductor substrate using the first vernier pattern as a mask, forming a trench of a first depth; forming a second vernier pattern having a width wider than that of the first vernier pattern the second vernier pattern including the first vernier pattern; performing an etch process using the second vernier pattern as a mask, thus forming a trench of a second depth, which has a step of a predetermined width, stripping the first and second vernier patterns and then forming an insulating film to bury the trench; and, etching the insulating film so that the semiconductor substrate of the vernier region is exposed.

According to a further aspect, the invention provides a method of forming an overlay accuracy measurement vernier, including the steps of providing a semiconductor substrate in which a cell region and a vernier region are defined; forming a plurality of isolation patterns on the semiconductor substrate of the cell region and forming a first vernier pattern on the semiconductor substrate of the vernier region; etching the semiconductor substrate of the vernier region using the first vernier pattern as a mask with the cell region being shielded, thereby forming a trench of a first depth; forming a second vernier pattern having a width wider than that of the first vernier pattern, the second vernier pattern including the first vernier pattern; performing an etch process using the cell pattern and the second vernier pattern as masks, thus forming an isolation trench in the semiconductor substrate of the cell region and a trench of a second depth, which has a step of a predetermined width, in the vernier region; stripping the isolation pattern and the first and second vernier patterns and then forming an insulating film to bury the trenches; and, etching the insulating film to expose the semiconductor substrate of the vernier region and then polishing the insulating film to expose the semiconductor substrate of the cell region.

The first vernier pattern may preferably have a width of 0.7 nm to 2 nm, and the second vernier pattern may preferably have a width, which is 0.2 nm to 0.4 nm wider than that of the first vernier pattern isotropically.

The etch process of the insulating film of the vernier region may preferably be performed so that the semiconductor substrate is exposed 200 Å to 400 Å higher than a surface of the insulating film.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention is described in detail below in connection with certain exemplary embodiments with reference to the accompanying drawings.

Figure 1:
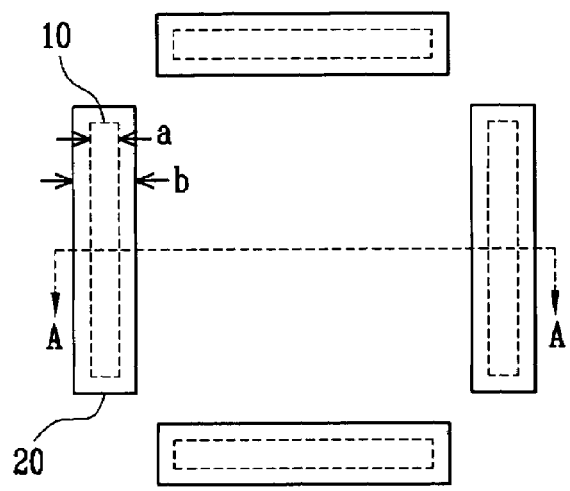
FIG. 1 is a layout diagram of an overlay accuracy measurement reference vernier mask used in the peri region in order to form an overlay accuracy measurement vernier according to an embodiment of the invention.

FIG. 1 is a layout diagram of an overlay accuracy measurement reference vernier mask used in the peri region in order to form an overlay accuracy measurement vernier according to an embodiment of the invention. FIGS. 2A to 2G are cross-sectional views illustrating a method of forming an overlay accuracy measurement vernier with line A-A of FIG. 1 being cutaway according to an embodiment of the invention.

Meanwhile, the cell region shown in FIGS. 2A to 2G is not formed by a mask shown in FIG. 1, but is shown for reference in order to describe the formation process of the vernier together with the formation process of the cell region.

Referring to FIG. 1, a mask for forming an overlay accuracy measurement vernier may have a variety of shapes such as box and bar. In the present embodiment, the mask includes a region (not shown), which serves as the guideline of the polish process, and four bars. Reference numeral 10 denotes a first mask for forming the overlay accuracy measurement vernier reference numeral 20 denotes an overlay accuracy measurement vernier versus a horizontal and vertical peripheral unit and a second mask made of 0.1 nm to 0.2 nm chromium (Cr). In FIG. 1, the vernier is not shown. If portions to be measured are located at the center of the four bar regions, measurement is possible using the overlay accuracy measurement vernier.

Figure 2A:
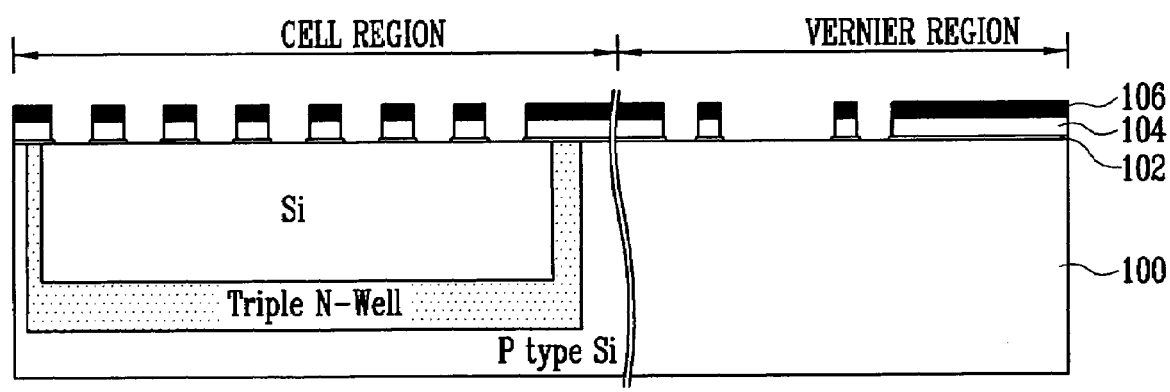
FIGS. 2A to 2G are cross-sectional views illustrating a method of forming an overlay accuracy measurement vernier with line A-A of FIG. 1 being cutaway according to an embodiment of the invention.

Referring to FIGS. 1 and 2A, a buffer oxide film 102, a nitride film 104, and a hard mask film 106 are formed on a semiconductor substrate 100 in which a cell region and a vernier region in which an overlay accuracy measurement vernier will be formed are defined. A portion of the hard mask film 106, the nitride film 104, and the buffer oxide film 102 of the cell region is etched to form isolation patterns. Vernier patterns are formed in the vernier region by photolithography and etch processes using the first mask 10 having a width "a." Isolation patterns having a predetermined width are also formed in the peri region.

Figure 2B:
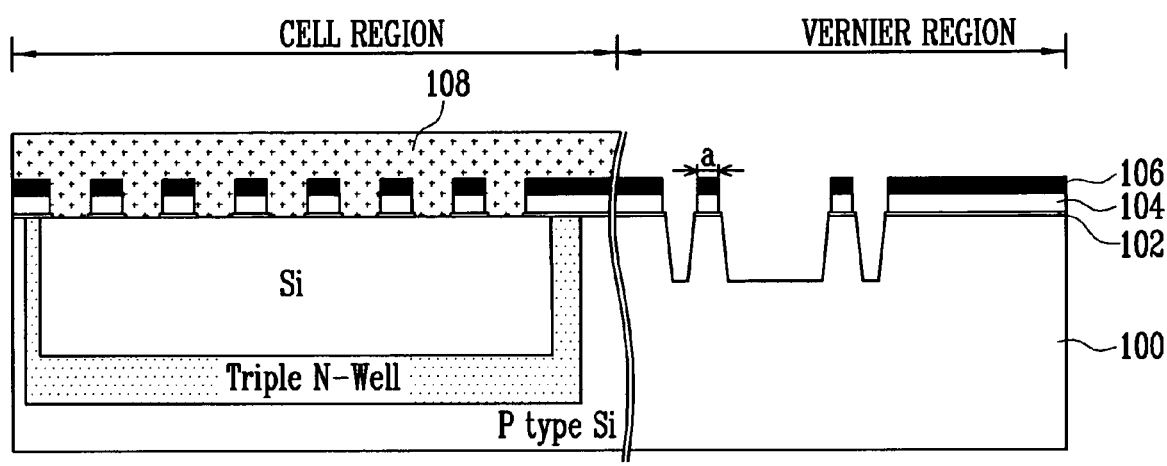

Referring to FIGS. 1 and 2B, a first photoresist film 108 is formed on the entire structure. The first photoresist film 108 is exposed and developed so that the cell region is shielded. In a state where the first photoresist film 108 is formed in the cell region, the semiconductor substrate 100 is etched to a predetermined depth using the vernier pattern as a mask, thus forming a trench in the vernier region. A trench is also formed in the peri region.

Figure 2C:
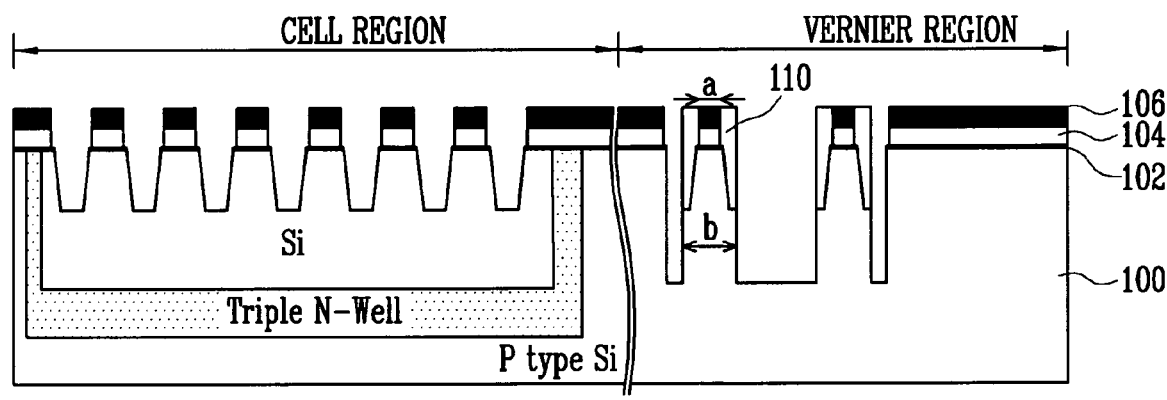

Referring to FIGS. 1 and 2C, the first photoresist film 108 formed in the cell region is stripped. After a second photoresist film 110 is formed on the entire structure, exposure and development processes using the second mask 20 having a width "b" in FIG. 1 are performed. Accordingly, the second photoresist film 110 is patterned so that the cell region is exposed and a part of the vernier region is shielded.

At this time, the peri region is shielded by the second photoresist film 110. The patterned second photoresist film 110 may have a width of about 0.15 μm in the overlay accuracy measurement vernier versus a horizontal and vertical peri unit. The width "a" may be in the range of 0.7 nm to 2 nm and the width "b" may be in the range of 0.9 nm to 2.4 nm.

The semiconductor substrate 100 of the vernier region is further etched using the patterned second photoresist film 110 and the isolation pattern of the cell region as masks, forming a dual deep trench. As a result, while a Puddle type step having the width "b" is formed in the overlay accuracy measurement vernier, the trench of a predetermined depth is formed in the cell region.

Figure 2D:
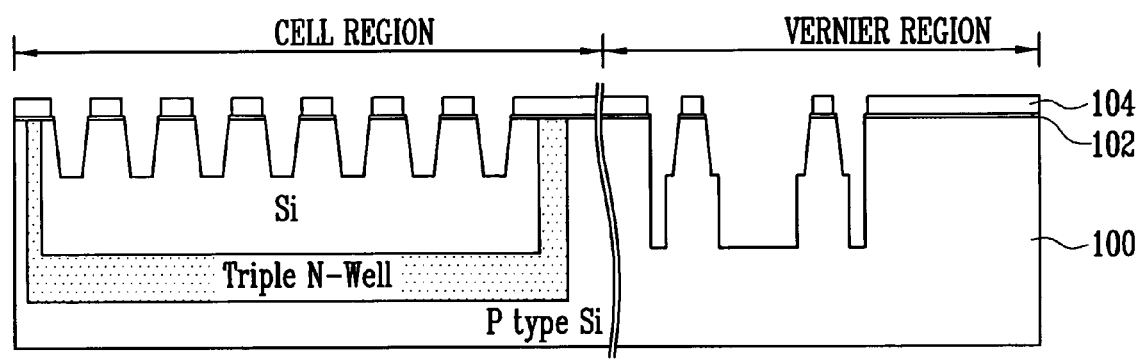

Referring to FIG. 2D, the second photoresist pattern 110 and the hard mask film 106 are stripped.

Figure 2E:
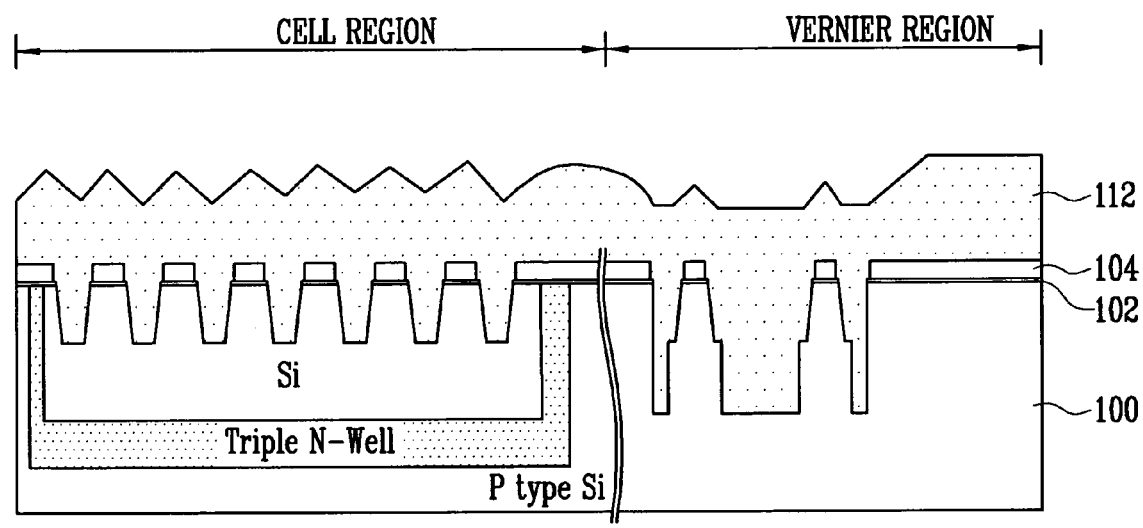

Referring to FIG. 2E, an insulating film 112 is formed on the entire structure so that the trenches are buried.

Figure 2F:
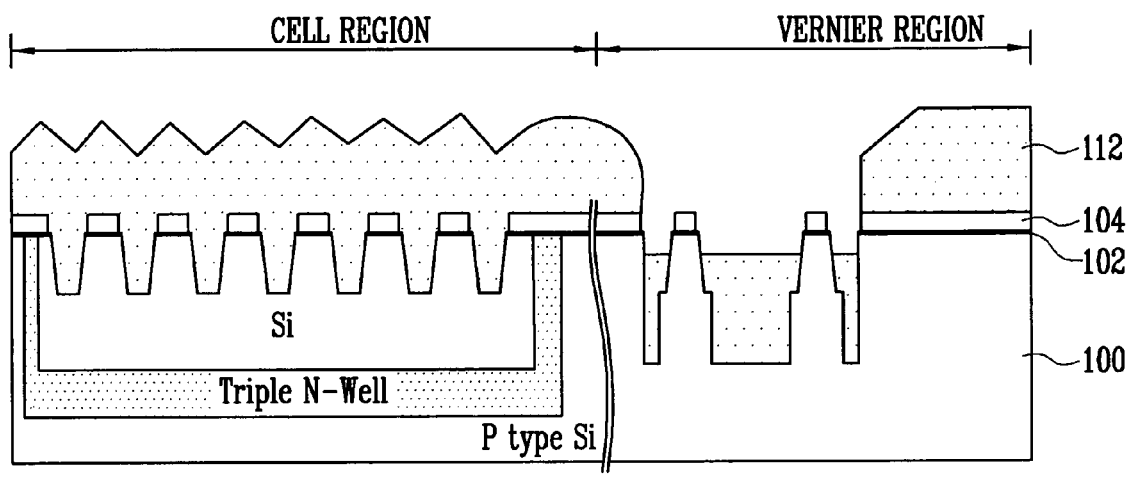

Referring to FIG. 2F, the insulating film 112 of the vernier region is etched to a predetermined thickness in order to reduce the irregularity and/or dishing of a chemical mechanical polish (CMP), which may occur due to a high step between the cell region and the peri region.

The insulating film 112 of the vernier region is preferably etched so that a top surface of the overlay accuracy measurement vernier is projected 200 Å to 600 Å higher than a surface of the insulating film.

Figure 2G:
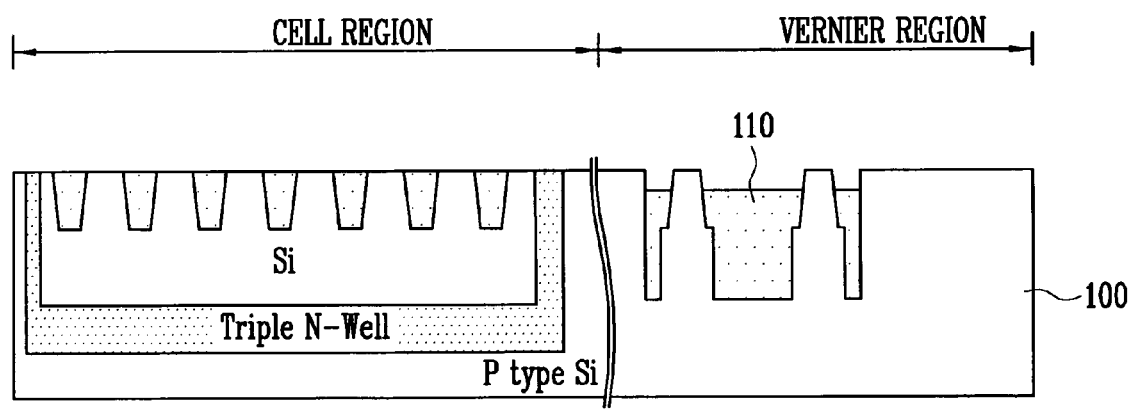

Referring to FIG. 2G, after a CMP process is performed, the nitride film 104 is stripped. If so, the first vernier having a predetermined width has an overlay accuracy measurement vernier in which a second vernier having a width narrower than that of the first vernier is formed on the first vernier.

In the above embodiment, an example in which the trench of the cell region and the step of the overlay accuracy measurement vernier formation region are formed at the same time has been described. However, after the trench is formed in the cell region, the step may be formed in the overlay accuracy measurement vernier formation region, or after the step is formed in the overlay accuracy measurement vernier formation region, the trench may be formed in the cell region with the peri region being shut.

Figure 3:
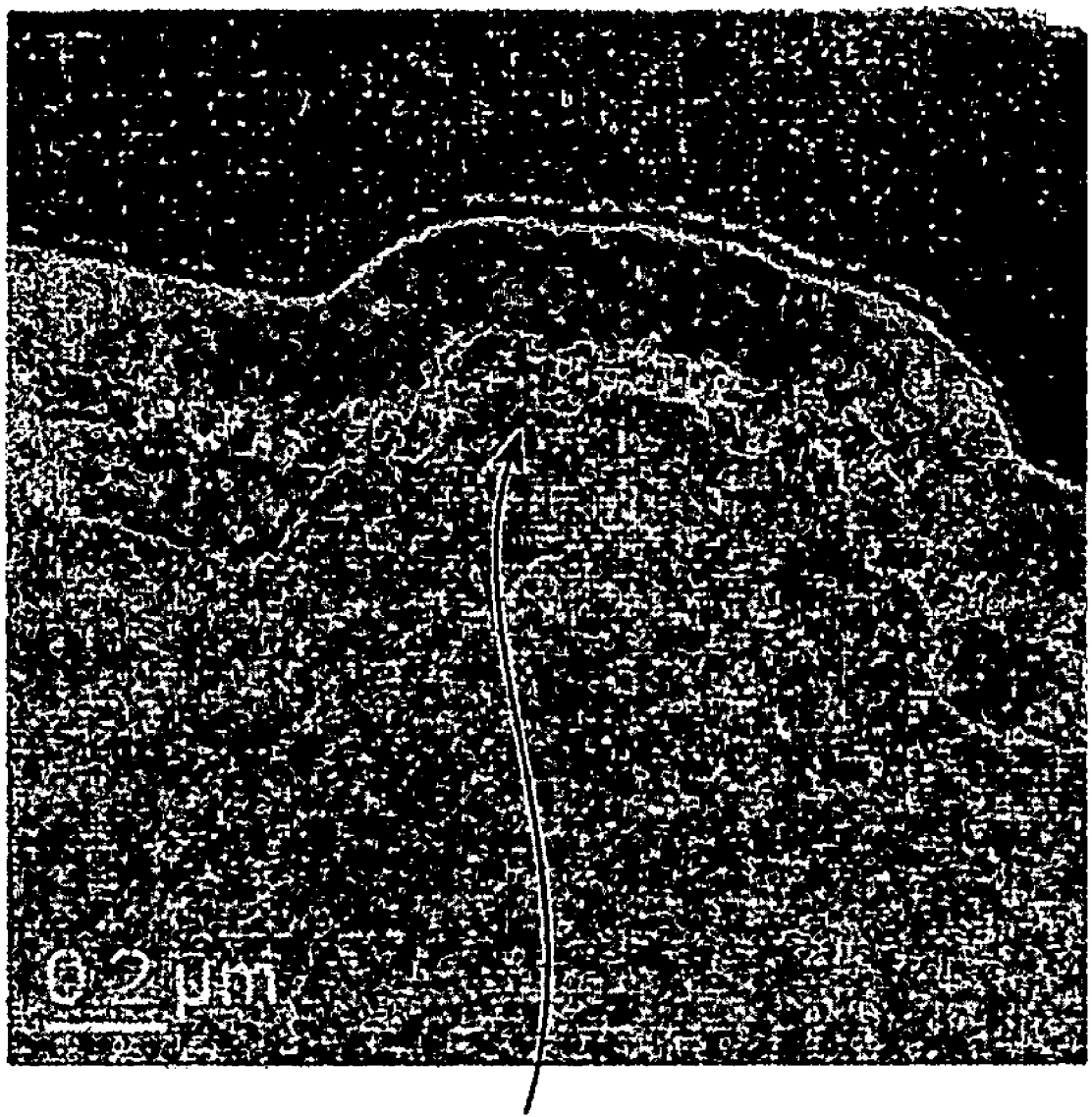
FIG. 3 is a cross-sectional view of a semiconductor device in which a Puddle type step is actually formed in a predetermined region of the overlay accuracy measurement vernier according to an embodiment of the invention.

FIG. 3 is a cross-sectional view of a semiconductor device in which a Puddle type step is actually formed in a predetermined region of the overlay accuracy measurement vernier according to an embodiment of the invention.

As shown in FIG. 3, if the processes of FIGS. 2A to 2G are performed, a Puddle type step is formed in the overlay accuracy measurement vernier in the peri region.

A measurement method will be described below. If a measurement apparatus recognizes a signal generated from the Puddle type step portion of the overlay accuracy measurement vernier as a peak value and calculates an average of the peak value, an accurate reference value of the overlay accuracy measurement vernier can be set.

Accordingly, since an accurate reference value of each overlay accuracy measurement vernier can be set as described above, more accurate measurement is possible without error.

According to the invention, in the process of forming the trench of the peri region in which the overlay accuracy measurement vernier is formed, a step necessary for overlay accuracy measurement is formed after the planarization process. It is therefore possible to prevent overlay accuracy measurement error.

Furthermore, according to the invention, since the key open process needs not to be performed, the process can be simplified.

While the invention has been described in connection with practical exemplary embodiments, the invention is not limited to the disclosed embodiments, but, on the contrary, is intended to cover various modifications and equivalent arrangements included within the spirit and scope of the appended claims.

What is claimed is:

1. A method of forming an overlay accuracy measurement vernier, the method comprising:
   forming a first vernier pattern in a predetermined region on a semiconductor substrate, said first vernier pattern having a width;
   etching the semiconductor substrate using the first vernier pattern as a mask, forming first trenches of a first depth;
   forming a second vernier pattern having a width wider than the width of the first vernier pattern, the second vernier pattern including the first vernier pattern;
   etching the semiconductor substrate using the second vernier pattern as a mask to form second trenches of a second depth in the first trenches, thereby forming dual depth trenches comprising the first trenches and the second trenches and having a step of a predetermined width;
   stripping the first and second vernier patterns and then forming an insulating film to bury the first and second trenches; and
   etching the insulating film so that at least a portion of the semiconductor substrate of the predetermined region is exposed.

2. The method of claim 1, wherein the first vernier pattern has a width of 0.7 nm to 2 nm, and the second vernier pattern has a width, which is 0.2 nm to 0.4 nm wider than that of the first vernier pattern isotropically.

3. A method of forming an overlay accuracy measurement vernier, the method comprising:
   providing a semiconductor substrate in which a cell region and a vernier region are defined;
   forming an isolation pattern on the semiconductor substrate of the cell region and forming a first vernier pattern on the semiconductor substrate of the vernier region, the first vernier pattern having a width;
   etching the semiconductor substrate of the vernier region using the first vernier pattern as a mask with the cell region being shielded, thereby forming first trenches of a first depth;
   forming a second vernier pattern having a width wider than the width of the first vernier pattern, the second vernier pattern including the first vernier pattern;
   etching the semiconductor substrate using the isolation pattern and the second vernier pattern as mask to form an isolation trench in the semiconductor substrate of the cell region and second trenches of a second depth in the first trenches, thereby forming dual depth trenches comprising the first trenches and the second trenches and having a step of a predetermined width, in the vernier region;
   stripping the isolation pattern and the first and second vernier patterns and then forming an insulating film to bury the trenches; and
   etching the insulating film to expose at least a portion of the semiconductor substrate of the vernier region and then polishing the insulating film to expose the semiconductor substrate of the cell region.

4. The method of claim 3, wherein the first vernier pattern has a width of 0.7 nm to 2 nm, and the second vernier pattern has a width, which is 0.2 nm to 0.4 nm wider than that of the first vernier pattern isotropically.

5. The method of claim 3, comprising performing the etch process of the insulating film of the vernier region so that the portion of the semiconductor substrate is exposed 200 Å to 400 Å higher than a surface of the insulating film.

* * * * *